(12) United States Patent
Shi et al.

(10) Patent No.: US 9,209,106 B2
(45) Date of Patent: Dec. 8, 2015

(54) THERMAL MANAGEMENT CIRCUIT BOARD FOR STACKED SEMICONDUCTOR CHIP DEVICE

(75) Inventors: Xiao Ling Shi, Ontario (CA); Suming Hu, Ontario (CA); Liane Martinez, Ontario (CA); Roden Topacio, Ontario (CA); Terence Cheung, San Diego, CA (US)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 402 days.

(21) Appl. No.: 13/529,720

(22) Filed: Jun. 21, 2012

(65) Prior Publication Data

US 2013/0343000 A1    Dec. 26, 2013

(51) Int. Cl.
| | | |
|---|---|---|
| H05K 7/20 | (2006.01) | |
| H01L 23/367 | (2006.01) | |
| H01L 23/498 | (2006.01) | |
| H05K 1/02 | (2006.01) | |
| H05K 3/34 | (2006.01) | |

(52) U.S. Cl.
CPC ...... *H01L 23/3677* (2013.01); *H01L 23/49833* (2013.01); *H05K 1/0206* (2013.01); *H01L 2224/16225* (2013.01); *H01L 2224/32245* (2013.01); *H01L 2224/73253* (2013.01); *H01L 2924/15311* (2013.01); *H05K 3/3436* (2013.01); *H05K 2201/10416* (2013.01); *Y10T 29/49139* (2015.01)

(58) Field of Classification Search
None
See application file for complete search history.

(56) References Cited

U.S. PATENT DOCUMENTS

| | | | |
|---|---|---|---|
| 6,018,193 A * | 1/2000 | Rubens et al. | 257/720 |
| 6,501,164 B1 | 12/2002 | Chen et al. | |
| 6,545,351 B1 * | 4/2003 | Jamieson et al. | 257/712 |
| 6,580,611 B1 | 6/2003 | Vandentop et al. | |
| 7,198,980 B2 | 4/2007 | Jiang et al. | |
| 2003/0189246 A1* | 10/2003 | Iwaki et al. | 257/706 |
| 2004/0217485 A1 | 11/2004 | Chung | |
| 2005/0037535 A1 | 2/2005 | Ogawa et al. | |
| 2005/0167798 A1 | 8/2005 | Doan | |
| 2006/0186535 A1 | 8/2006 | Baker et al. | |
| 2007/0227761 A1* | 10/2007 | Tuominen et al. | 174/252 |
| 2008/0296599 A1* | 12/2008 | Mazzochette | 257/98 |
| 2010/0315787 A1 | 12/2010 | Li et al. | |
| 2012/0075807 A1 | 3/2012 | Refai-Ahmed et al. | |

OTHER PUBLICATIONS

PCT/US2013/046043 International Search Report mailed Oct. 24, 2013.

* cited by examiner

*Primary Examiner* — Courtney Smith
(74) *Attorney, Agent, or Firm* — Timothy M. Honeycutt

(57) ABSTRACT

A method of assembling a semiconductor chip device is provided. The method includes providing a first circuit board that has a plurality of thermally conductive vias. A second circuit board is mounted on the first circuit board over and in thermal contact with the thermally conductive vias. The second circuit board includes first side facing the first circuit board and a second and opposite side.

28 Claims, 5 Drawing Sheets

THERMAL MANAGEMENT CIRCUIT BOARD FOR STACKED SEMICONDUCTOR CHIP DEVICE

BACKGROUND OF THE INVENTION

1. Field of the Invention

This invention relates generally to semiconductor processing and devices, and more particularly to thermal management structures for stacked semiconductor chips and to methods of assembling the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as processors (e.g., CPUs, GPUs, DSPs, devices combining a GPU and CPU on a die, which are sometimes referred to as APUs, etc.), generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

Thermal management of a semiconductor chip or chips in a stacked arrangement remains a technical challenge during required electrical testing of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

The present invention is directed to overcoming or reducing the effects of one or more of the foregoing disadvantages.

SUMMARY OF EMBODIMENTS OF THE INVENTION

In accordance with one aspect of an embodiment of the present invention, a method of assembling a semiconductor chip device is provided. The method includes providing a first circuit board that has a plurality of thermally conductive vias. A second circuit board is mounted on the first circuit board over and in thermal contact with the thermally conductive vias. The second circuit board includes first side facing the first circuit board and a second and opposite side.

In accordance with another aspect of an embodiment of the present invention, a method of manufacturing is provided that includes fabricating a plurality of thermally conductive vias in a first circuit board. A second circuit board is mounted on the first circuit board over and in thermal contact with the thermally conductive vias. The second circuit board includes first side facing the first circuit board and a second and opposite side.

In accordance with another aspect of an embodiment of the present invention, an apparatus is provided that includes a first circuit board with a plurality of thermally conductive vias. A second circuit board is mounted on the first circuit board over and in thermal contact with the thermally conductive vias. The second circuit board includes first side facing the first circuit board and a second and opposite side.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate a first circuit board with plural thermally conductive vias that are designed to convey heat from a second circuit board mounted to the first. The second circuit board may have a bottom-mounted semiconductor chip also in thermal contact with the thermal vias. The first circuit board may include an opening to accommodate the bottom-mounted semiconductor chip and an optional heat spreader mounted to the semiconductor chip. With the thermal vias in place, the first circuit board doubles (i.e., additionally operates) as a heat spreader. Additional details will now be described.

Figure 1:
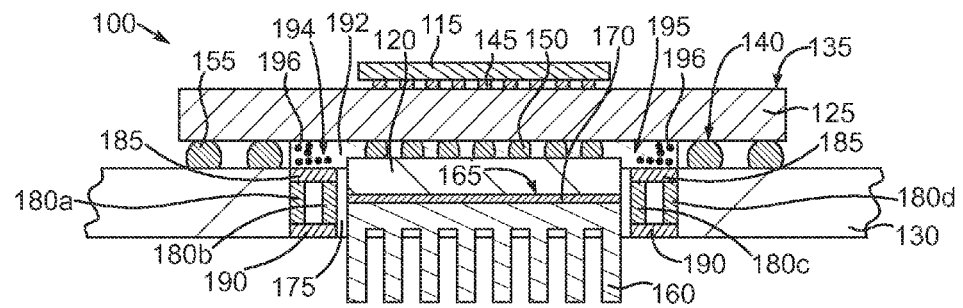
FIG. 1 is a sectional view of an exemplary embodiment of a semiconductor chip device that includes two semiconductor chips connected to a circuit board mounted to another circuit board.

In the drawings described below, reference numerals are generally repeated where identical elements appear in more than one figure. Turning now to the drawings, and in particular to FIG. 1, therein is shown a sectional view of an exemplary embodiment of a semiconductor chip device 100 that includes two semiconductor chips 115 and 120 connected to a circuit board 125. The circuit board 125 may, in turn, be mounted on another circuit board 130. The semiconductor chip 115 may be mounted to an upper side 135 of the circuit board 125 and the semiconductor chip 120 may be mounted to a lower side 140 of the circuit board 125. The designations "upper" and "lower" are somewhat arbitrary in the context of this disclosure. The semiconductor chip 115 may be electrically connected to the circuit board 125 by way of plural interconnect structures 145, which may be solder bumps, micro bumps, conductive pillars plus solder or other types of interconnects. Exemplary materials include copper, aluminum, gold, platinum, palladium, silver, tin, lead combinations of these or others. The semiconductor chip 120 may be electrically connected to the circuit board 125 by way of plural interconnect structures 150 which may be configured like the interconnect structures 150 and constructed of the same types of materials. Finally, the circuit board 125 may be electrically connected to the circuit board 130 by way of plural interconnect structures 155 which may be solder bumps, conductive pillars plus solder or other types of interconnects composed of the materials just described.

The semiconductor chips 115 and 120 may be any of a variety of different types of circuit devices used in electronics, such as, for example, interposers, microprocessors, graphics processors, combined microprocessor/graphics processors, application specific integrated circuits, memory devices or the like, and may be single or multi-core. The semiconductor chips 115 and 120 may be constructed of bulk semiconductor, such as silicon or germanium, or semiconductor-on-insulator materials, such as silicon-on-insulator materials or even insulator materials. Thus, the term "semiconductor chip" even contemplates insulating materials. Here, the semiconductor chip device 10 includes two semiconductor chips 115 and 120 in a stack. However, more than two may be used.

The circuit board 125 may be another semiconductor chip of the type described above, a semiconductor chip package substrate, a circuit card, or virtually any other type of printed circuit board. Although a monolithic structure could be used for the circuit board 125, a more typical configuration will utilize a build-up design. In this regard, the circuit board 125 may consist of a central core upon which one or more build-up layers are formed and below which an additional one or more build-up layers are formed. The core itself may consist of a stack of one or more layers. So-called "coreless" designs may be used as well. The layers of the circuit board 125 may consist of an insulating material, such as various well-known epoxies or other resins interspersed with metal interconnects. A multi-layer configuration other than buildup could be used. Optionally, the circuit board 125 may be composed of well-known ceramics or other materials suitable for package substrates or other printed circuit boards.

The circuit board 130 may be a system board, a circuit card or virtually any other type of printed circuit board. Like the circuit board 125, the circuit board could be monolithic or a laminate. If a laminate, well-known epoxy resins impregnated with glass or other fillers may be used. The circuit boards 125 and 130 may include multiple layers of metallization (not shown). The semiconductor chips 115 and 120 may also include multiple layers of metallization (again not shown).

Various mechanisms are provided to transfer heat from various portions of the semiconductor chip device 100. For example, a heat sink 160 may be connected to a lower side 165 of the semiconductor chip 120 by way of a thermal interface material layer 170. The thermal interface material layer 170 may be composed of a variety of different types of thermal interface material suitable for thermal management, such as, silicone rubber, silicone greases, acrylic polymers or the like. Even metallic materials, such as indium, gallium, various solders or the like could be used. The heat sink 160 may take on a myriad of configurations such as the heat-finned heat spreader arrangement as shown or virtually any other type of heat transfer device design. If desired, the heat sink 160 may include a vapor chamber and/or a solid state thermoelectric cooler. Various types of materials suitable for heat transfer devices may be used, such as copper, nickel, aluminum, steel, combinations of these or the like. Somewhat more exotic materials, such as diamond or sapphire, could also be used for extreme thermal environments. To accommodate the spatial positioning of the semiconductor chip 120 and the heat sink 160, the circuit board 130 may be provided with a suitable opening 175 in which the semiconductor chip 120 and the heat sink 160 project. It is anticipated that the circuit board 130 may be fabricated along with the opening 175 in a variety of ways. For example, either material removal or deliberate patterning techniques may be used to establish the opening 175. In this regard, the circuit board 130 could be fabricated as a relatively planar structure and thereafter a suitable material removal process may be used in order to form the opening 175. Again, electrical routing structures (not visible) would have to be placed outside the location of where the opening 175 is intended to be made. The material removal could be by chemical etch, laser oblation or other material removal techniques. On the other hand, if a patterning technique is used to establish the opening 175, then the opening 175 may be formed as the circuit board 130 is formed. This may be accomplished for example where the circuit board 130 is of a buildup design by some sort of hard masking in the location where the opening 175 is to be formed during each subsequent insulating material deposition step so that material is not positioned where the opening 175 is intended to be. Obviously such hard masking would have to be by way of a material that does not readily wet to whatever epoxies or other types of organic compounds that are used to form the various buildup layers that make up the circuit board 130 in that context. Since the opening 175 does eliminate some portions of the circuit board 130 that would otherwise be available for the routing and traces, the loss of available circuit board volume will have to be compensated during layout of the conductor traces for the circuit board 130.

To further enhance the transfer of heat from at least the circuit board 125, the circuit board 130 may be provided with plural thermally conductive vias (hereinafter "thermal vias"), four of which are visible in FIG. 1 and labeled 180a, 180b, 180c and 180d. The thermal vias 180a, 180b, 180c and 180d (and other disclosed alternatives) may be electrically floating and thus non-functional, or operable to be at some bias level and thus electrically functional. As will become apparent in subsequent figures, there may be many more than just four of the thermal vias 180*a*, 180*b*, 180*c* and 180*d*. The thermal vias 180*a*, 180*b*, 180*c* and 180*d* may be capped above by a patterned metal line 185 and below by another patterned metal line 190 that are both formed on or in the circuit board 130. The thermal vias 180*a*, 180*b*, 180*c* and 180*d* and the patterned metal lines 185 and 190, and any disclosed alternatives thereto, may be composed of a variety of thermally conducting materials, such as solders, metals and alloys. Exemplary materials include copper, aluminum, gold, platinum, palladium, silver, tin, lead combinations of these or others. Well-known fabrication processes may be used to form the thermal vias 180*a*, 180*b*, 180*c* and 180*d* and the patterned metal lines 185 and 190, such as plating, chemical vapor deposition, physical vapor deposition or others. Via openings may be etched, laser drilled or otherwise formed. The arrangement and number of the thermal vias 180*a*, 180*b*, 180*c* and 180*d* and the patterned metal lines 185 and 190 may take on an enormous variety of configurations. A few of these exemplary configurations will be illustrated in subsequent figures.

A thermally conductive pathway between the circuit board 125 and the thermal vias 180*a*, 180*b*, 180*c* and 180*d* is established by positioning an underfill material layer 192 between the circuit board 125 and the circuit board 130 but in thermal contact with the patterned metal line 185. The underfill material layer 195 may be composed of a variety of materials suitable for underfill such as epoxy resin with or without silica fillers and phenol resins or the like. Two examples are types 8437-2 and 2BD available from Namics.

If desired, the thermal conductivity of the regions 194 and 195 of the underfill layer 192 proximate the thermal vias 180*a* and 180*b* and the thermal vias 180*c* and 180*d*, respectively, may be enhanced by impregnating or otherwise dispersing thermally conductive particles 196, such as nano spheres or other particles composed of gold, copper, silver or other thermally conductive materials. It should be understood that the particles 196 could be dispersed around the entire perimeter of the semiconductor chip 120 if desired. If the particles 196 are used, care should be exercised to avoid shorting the interconnect structures 150 and 155. The particles 196 could be used in any of the disclosed embodiments.

Figure 2:
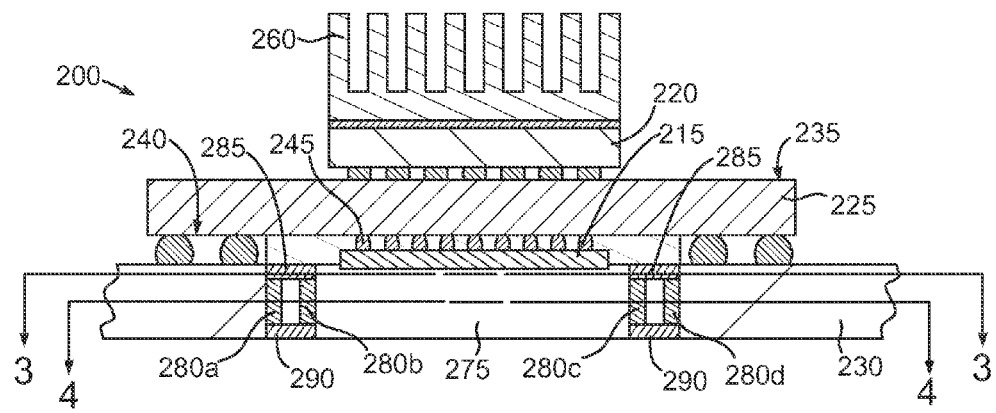
FIG. 2 is a sectional view like FIG. 1, but of an alternate exemplary embodiment of a semiconductor chip device that includes two semiconductor chips connected to a circuit board mounted to another circuit board.

An alternate exemplary embodiment of a semiconductor chip device 200 may be understood by referring now to FIG. 2, which is a sectional view similar to the sectional view depicted in FIG. 1. The semiconductor chip device 200 shares many attributes of the semiconductor chip device embodiment 100 depicted in FIG. 1 and described above. Thus, the device 200 may include semiconductor chips 215 and 220 mounted to a circuit board 225 and the circuit board 225 may be in turn mounted to a circuit board 230. The semiconductor chips 215 and 220 and the circuit boards 225 and 230 may be configured like the corresponding components of the semiconductor chip device 100 described above in conjunction with FIG. 1. Here, however, the relative positions of the semiconductor chips 215 and 220 are swapped, that is, the semiconductor chip 220 is mounted on the upper surface 235 of the circuit board 225 and the semiconductor chip 215 is mounted on the lower surface 240 of the circuit board 225. The positions of the interconnect structures 245 and 250 are also flip-flopped from the positions of the interconnect structures 145 and 150 in FIG. 1. In this case, the heat sink 260 is also mounted to the semiconductor chip 220, but due to its position, does not project through the opening 275 in the circuit board 230. Depending upon the thickness of the semiconductor chip 215 and the height of the interconnect structures 245, some or all of semiconductor chip 215 may project into the opening 275 as shown.

Like the circuit board 130, the circuit board 230 may be provided with thermal vias 280*a*, 280*b*, 280*c* and 280*d* and patterned metal lines 285 and 290. Again, it should be understood that the thermal vias 280*a*, 280*b*, 280*c* and 280*d* may number more than four.

Figure 3:
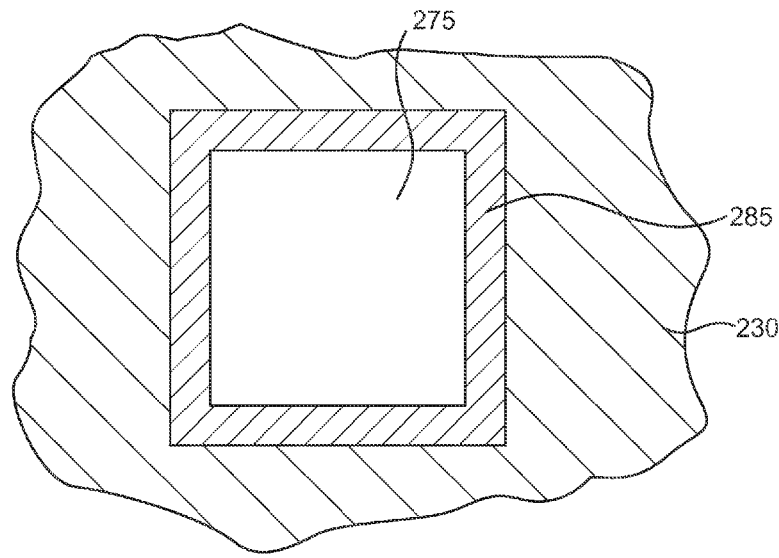
FIG. 3 is a sectional view of FIG. 2 taken at section 3-3.
Figure 4:
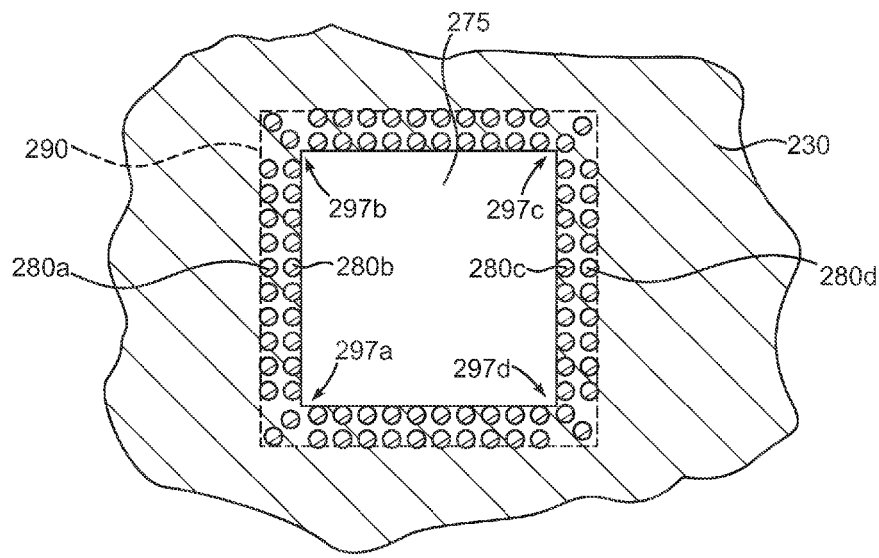
FIG. 4 is a sectional view of FIG. 2 taken at section 4-4.

Additional details of the patterned metal line 285 and the thermal vias 280*a*, 280*b*, 280*c* and 280*d* may be understood by referring now to FIGS. 3 and 4. FIG. 3 is a sectional view of FIG. 2 taken at section 3-3 and FIG. 4 is a sectional view of FIG. 2 taken at section 4-4. Only portions of the circuit board 230 are depicted in FIGS. 3 and 4. The following description of thermal vias 280*a*, 280*b*, 280*c* and 280*d* and the patterned metal line 285 will be illustrative also of the thermal vias 180*a*, 180*b*, 180*c* and 180*d* and the patterned metal line 185 associated with the circuit board 130 depicted in FIG. 1. Turning first to FIG. 3, the patterned metal line 285 is shown in section and appears as a square or rectangular frame structure that surrounds the opening 275 in the circuit board 230. In this illustrative embodiment, the patterned metal line 285 may be a continuous frame member as depicted. However, the skilled artisan will appreciate that a segmented design may also be used. The patterned metal line 285 may be square, rectangular or have virtually any other footprint. The opening 275 may similarly be square, rectangular or have virtually any other footprint.

An exemplary arrangement of the thermal vias 280*a*, 280*b*, 280*c* and 280*d* will now be described in conjunction with FIG. 4. In this illustrative embodiment, the thermal vias 280*a*, 280*b*, 280*c* and 280*d* and the multitude of others that are not separately labeled may be arranged around the perimeter of the opening 275 as shown. Here, the thermal vias 280*a* and 280*b*, for example, are arranged in pairs two abreast. However, the skilled artisan will appreciate that the number and spatial arrangement of thermal vias 280*a*, 280*b*, 280*c* and 280*d* may be more than two and in a variety of different spatial arrangements. Note that the portions of the circuit board 230 near the corners 297*a*, 297*b*, 297*c* and 297*d* of the opening 275 may be populated with some of the thermal vias as desired. It should be understood that the patterned metal line 290 depicted in section in FIG. 2 and shown in dashed in FIG. 4 may have the same footprint as the patterned metal line 285 shown in FIG. 3 or some different configuration as desired.

Figure 5:
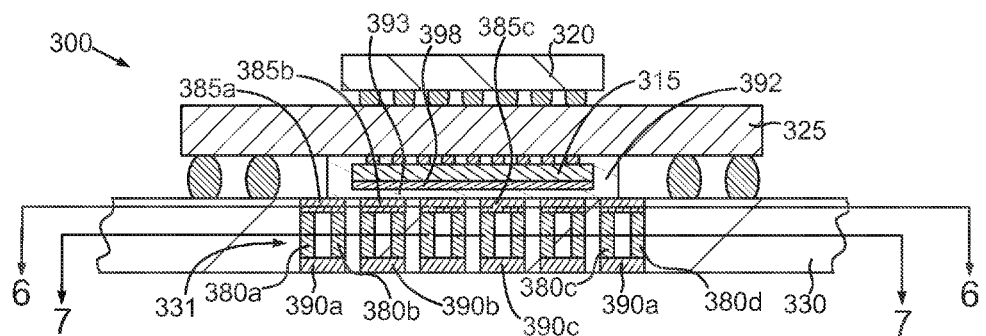
FIG. 5 is a sectional view like FIG. 1, but of an alternate exemplary embodiment of a semiconductor chip device that includes two semiconductor chips connected to a circuit board mounted to another circuit board.

Another alternate exemplary embodiment of a semiconductor chip device 300 may be understood by referring now to FIG. 5, which is a sectional view. This illustrative embodiment of a semiconductor chip device 300 shares several attributes with the other embodiments of the chip device 100 and 200 described above, namely, the mounting of the semiconductor chips 315 and 320 to the circuit board 325. Here, however, the circuit board 325 may be mounted to a circuit board 330 that does not include an opening like the openings 175 and 275 depicted in FIGS. 1 and 2 to accommodate a bottom-mounted heat sink. Instead, the region 331 beneath the semiconductor chip 315 is populated by an array of thermal vias, a few of which are labeled, 380*a*, 380*b*, 380*c* and 380*d*, that may be capped above by respective patterned metal lines 385*a*, 385*b* and 385*c* and capped below by corresponding patterned metal lines 390*a*, 390*b* and 390*c*. A thermally conductive pathway between the semiconductor chip 315 and the thermal vias 380*a*, 380*b*, 380*c* and 380*d* may be established by positioning the thermal interface material 392 between the circuit board 325 and the circuit board 330 and in between a gap 393 that may exist between the semiconductor chip 315 and the circuit board 330 and in particular between a thermal pad 398 which may be attached to the semiconductor chip 315 to provide an improved thermal interface. In addition, the thermal interface material 392 is in thermal contact with at least some portion of the thermal vias 380a, 380b, 380c and 380d by way of, for example, the patterned metal lines 385a, 385b and 385c.

Figure 6:
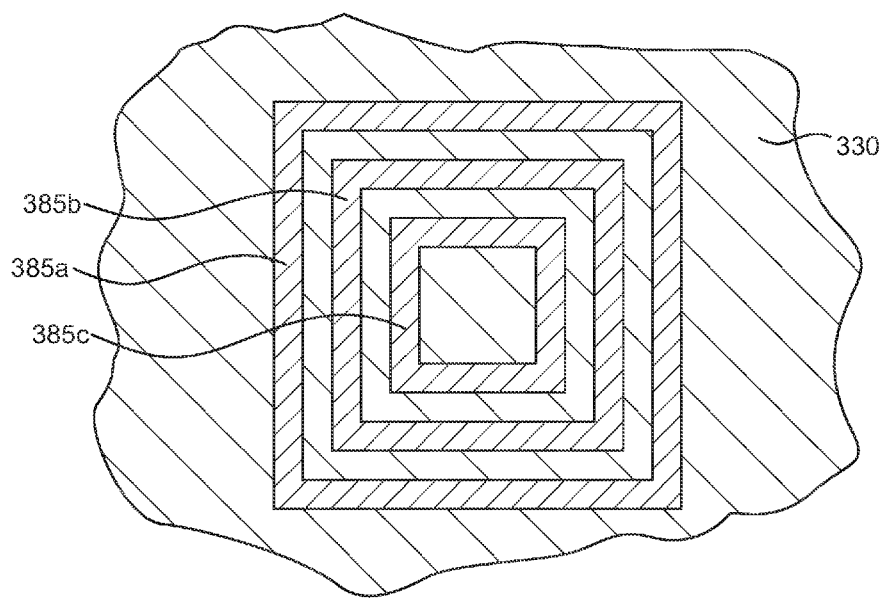
FIG. 6 is a sectional view of FIG. 5 taken at section 6-6.
Figure 7:
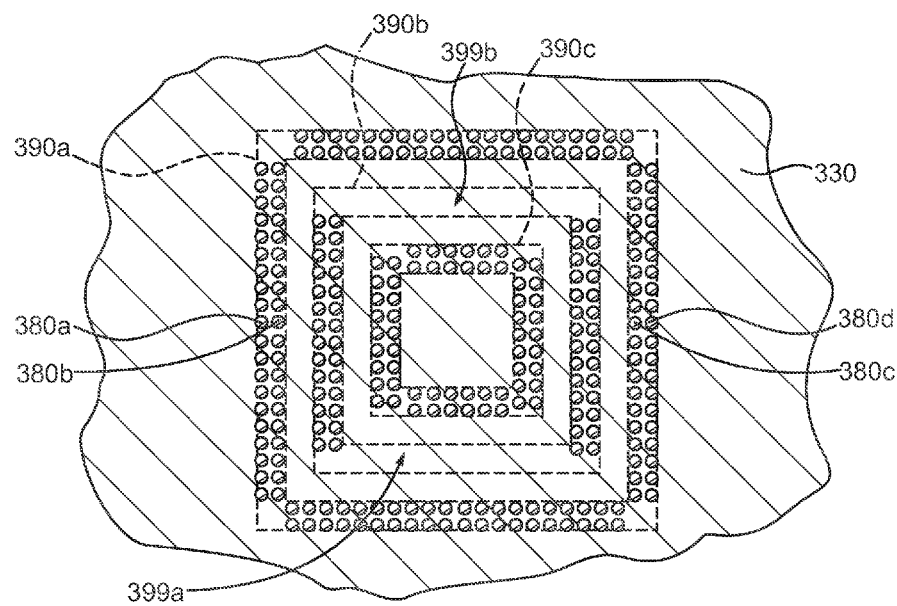
FIG. 7 is a sectional view of FIG. 5 taken at section 7-7.

More details regarding the patterned metal lines 385a, 385b and 385c and the thermal vias 380a, 380b, 380c and 380d may be understood by referring now to FIGS. 6 and 7 which are sectional views of FIG. 5 taken at sections 6-6 and 7-7, respectively. Attention is turned first to FIG. 6, which shows a portion of the circuit board 330 and the patterned metal lines 385a, 385b and 385c in section. Here, the patterned metal lines 385a, 385b and 385c may be patterned as concentric rectangular frame members as shown. However, as noted elsewhere herein, the patterned metal lines 385a, 385b and 385c may be segmented and patterned with other than square or rectangular shapes as desired. In addition, the number of patterned metal lines 385a, 385b and 385c may be other than three.

The exemplary array of thermal vias 380a, 380b, 380c and 380d may be understood by referring now to FIG. 7. As FIG. 7 illustrates, the number of thermal vias 380a, 380b, 380c and 380d may be substantially more numerous than the four that are separately labeled 380a, 380b, 380c and 380d in FIGS. 5 and 7. Here, some or all of the thermal vias 380a, 380b, 380c and 380d may be positioned around the perimeters of the patterned metal lines 390a, 390b and 390c, which are shown in dashed.

It may be desirable to thermally map the heat output of the semiconductor chip 315 and the circuit board 335 depicted in FIG. 5 and then concentrate the thermal vias 380a, 380b, 380c and 380d in those places exhibiting the highest heat flux. Conversely, areas that do not exhibit significant heat flux may be devoid of thermal vias 380a, 380b, 380c and 380d as desired. Thus, the regions 398a and 398b of the circuit board 330 may be relatively devoid of the thermal vias 380a, 380b, 380c and 380d whereas the other areas may be highly concentrated with thermal vias 380a, 380b, 380c and 380d as shown.

Figure 8:
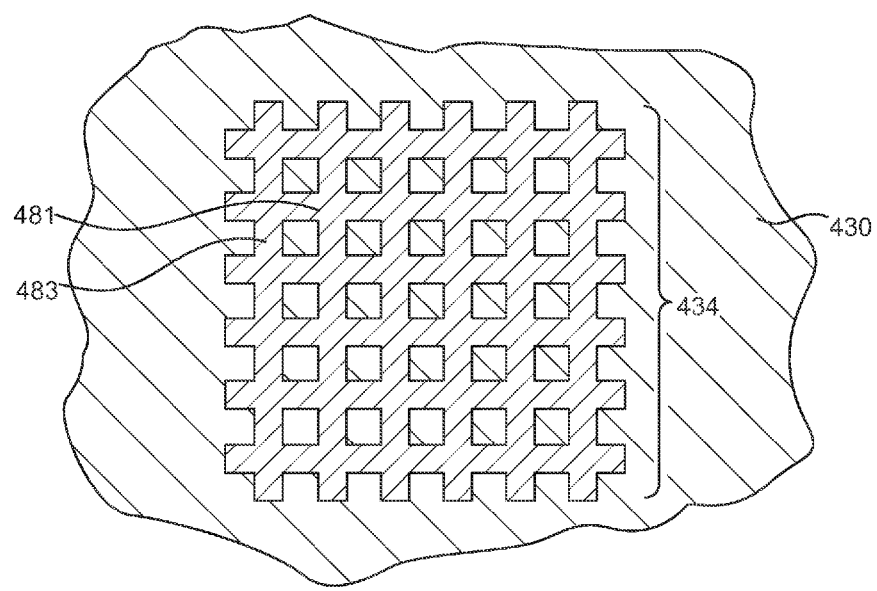
FIG. 8 is a sectional view like FIG. 6, but of an alternate exemplary circuit board and patterned metal line arrangement.

As noted elsewhere herein, the patterned metal lines capping the various thermal vias from above and below may take on a variety of configurations. In the foregoing illustrative embodiments, the patterned metal lines have been illustrated as square or rectangular frame members. However, FIG. 8 depicts a sectional view of an alternate exemplary embodiment of a circuit board 430 that includes a patterned metal line array 434 that serves the function of, for example, the patterned metal lines 385a, 385b and 385c and depicted in FIG. 6 or the patterned metal line 285 depicted in FIG. 3 or even the patterned metal lines 285a, 285b and 285c or 190 described above. Here, the patterned metal line array 434 may be patterned in the waffle-like arrangement with intersecting lines 481 and 483 as shown. This type of arrangement may provide enhanced thermal conductivity between adjacent patterned metal lines.

Figure 9:
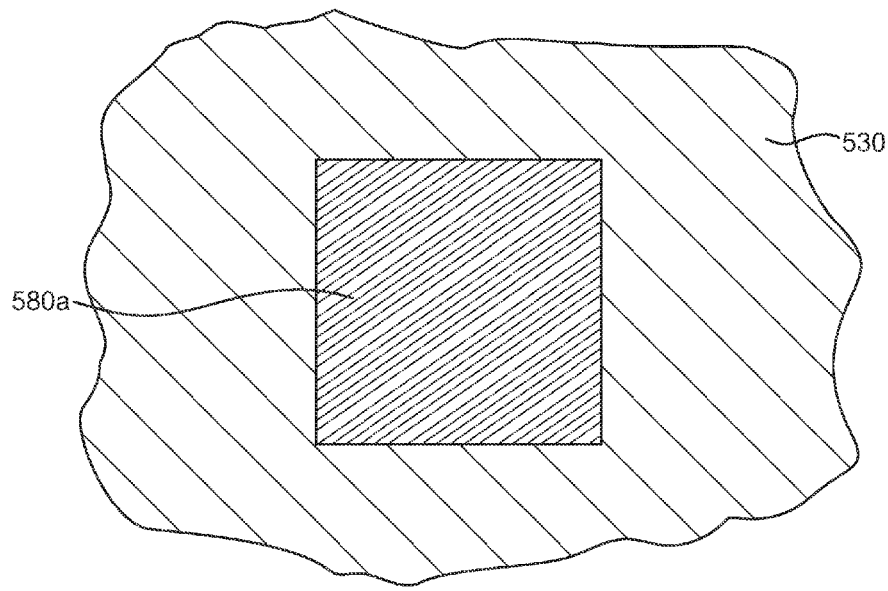
FIG. 9 is a sectional view depicting a small portion of an alternate exemplary circuit board and alternate exemplary thermal via.
Figure 10:
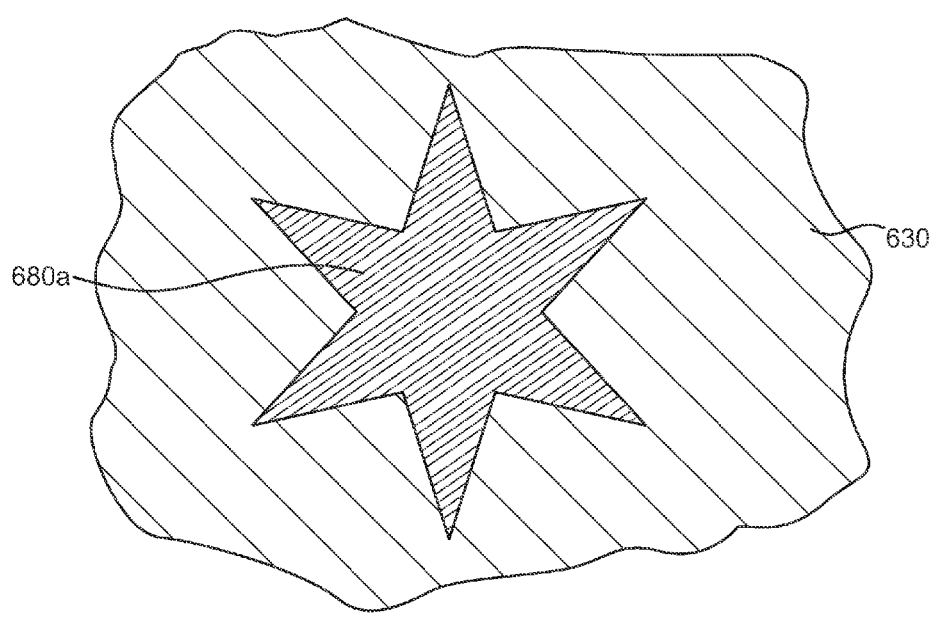
FIG. 10 is a sectional view like FIG. 9, but depicting a small portion of another alternate exemplary circuit board and another alternate exemplary thermal via.

In the foregoing illustrative embodiments, the thermal vias 180a, 280a, etc., are fabricated with a circular footprint. However, due to the tremendous flexibility of prevailing lithography, laser drilling, and material deposition processes, thermal via size and shape may be tailored to produce a variety of shapes. For example FIG. 9 depicts a sectional view of a circuit board 530 that includes plural thermal vias, one of which is visible, labeled 580a and fabricated with a square footprint. In yet another example, FIG. 10 depicts a sectional view of a circuit board 630 that includes plural thermal vias, one of which is visible, labeled 680a and fabricated with a star-shaped footprint. These thermal vias 580a and 680a represent just a few possibilities.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of assembling a semiconductor chip device, comprising:
   providing a first circuit board including a plurality of thermally conductive vias;
   mounting a second circuit board on the first circuit board over and in thermal contact with the thermally conductive vias, the second circuit board including first side facing the first circuit board and a second and opposite side; and
   coupling a first semiconductor chip on the first side of the second circuit board over and in thermal contact with the thermally conductive vias, at least a portion of the first semiconductor chip extending beyond the first side of the second circuit board.

2. The method of claim 1, comprising placing an underfill material between and in thermal contact with the second circuit board and at least some of the thermally conductive vias.

3. The method of claim 2, wherein the underfill material includes thermally conductive particles proximate at least some of the thermally conductive vias.

4. The method of claim 1, wherein the first circuit board includes an opening, the thermally conductive vias being arranged around a perimeter of the opening.

5. The method of claim 4, wherein at least a portion of the first semiconductor chip is positioned in the opening.

6. The method of claim 4, comprising coupling a heat sink to the first semiconductor chip, at least a portion of one or both of the first semiconductor chip and the heat sink being positioned in the opening.

7. The method of claim 1, comprising coupling a first semiconductor chip to the first side of the second circuit board over and in thermal contact with the thermally conductive vias, and a second semiconductor chip to the second side of the second circuit board.

8. The method of claim 1, wherein the first circuit board comprises a first plurality of patterned metal lines coupled to first ends of the thermally conductive vias and a second plurality of patterned metal lines coupled to second ends of the thermally conductive vias.

9. The method of claim 1, wherein the thermally conductive vias are electrically non-functional.

10. A method of manufacturing, comprising:
fabricating a plurality of thermally conductive vias in a first circuit board;
mounting a second circuit board on the first circuit board over and in thermal contact with the thermally conductive vias, the second circuit board including first side facing the first circuit board and a second and opposite side; and
coupling a first semiconductor chip on the first side of the second circuit board over and in thermal contact with the thermally conductive vias, at least a portion of the first semiconductor chip extending beyond the first side of the second circuit board.

11. The method of claim 10, comprising placing an underfill material between and in thermal contact with the second circuit board and at least some of the thermally conductive vias.

12. The method of claim 11, wherein the underfill material includes thermally conductive particles proximate at least some of the thermally conductive vias.

13. The method of claim 10, comprising fabricating an opening in the first circuit board and arranging the thermally conductive vias around a perimeter of the opening.

14. The method of claim 13, wherein at least a portion of the first semiconductor chip is positioned in the opening.

15. The method of claim 13, comprising coupling a heat sink to the first semiconductor chip, at least a portion of one or both of the first semiconductor chip and the heat sink being positioned in the opening.

16. The method of claim 10, comprising coupling a first semiconductor chip to the first side of the second circuit board over and in thermal contact with the thermally conductive vias, and a second semiconductor chip to the second side of the second circuit board.

17. The method of claim 10, comprising forming a first plurality of patterned metal lines coupled to first ends of the thermally conductive vias and a second plurality of patterned metal lines coupled to second ends of the thermally conductive vias.

18. The method of claim 10, comprising forming the thermally conductive vias using instructions stored in a computer readable medium.

19. The method of claim 10, wherein the thermally conductive vias are electrically non-functional.

20. An apparatus, comprising:
a first circuit board having a plurality of thermally conductive vias;
a second circuit board mounted on the first circuit board over and in thermal contact with the thermally conductive vias, the second circuit board including first side facing the first circuit board and a second and opposite side; and
a first semiconductor chip coupled on the first side of the second circuit board over and in thermal contact with the thermally conductive vias, at least a portion of the first semiconductor chip extending beyond the first side of the second circuit board.

21. The apparatus of claim 20, comprising an underfill material positioned between and in thermal contact with the second circuit board and at least some of the thermally conductive vias.

22. The apparatus of claim 21, wherein the underfill material includes thermally conductive particles proximate at least some of the thermally conductive vias.

23. The apparatus of claim 20, wherein at least a portion of the first semiconductor chip is positioned in the opening.

24. The apparatus of claim 20, wherein the first circuit board includes an opening, the thermally conductive vias being arranged around a perimeter of the opening.

25. The apparatus of claim 24, comprising a heat sink coupled to the first semiconductor chip, at least a portion of one or both of the first semiconductor chip and the heat sink being positioned in the opening.

26. The apparatus of claim 20, comprising a first semiconductor chip coupled to the first side of the second circuit board over and in thermal contact with the thermally conductive vias, and a second semiconductor chip coupled to the second side of the second circuit board.

27. The apparatus of claim 20, comprising a first plurality of patterned metal lines coupled to first ends of the thermally conductive vias and a second plurality of patterned metal lines coupled to second ends of the thermally conductive vias.

28. The apparatus of claim 20, wherein the thermally conductive vias are electrically non-functional.

* * * * *